United States Patent
Arnott et al.

(10) Patent No.: US 11,184,706 B2
(45) Date of Patent: Nov. 23, 2021

(54) LOUDSPEAKER EXCURSION PROTECTION

(71) Applicant: DOLBY LABORATORIES LICENSING CORPORATION, San Francisco, CA (US)

(72) Inventors: Brian George Arnott, Wahroonga (AU); Nicholas Luke Appleton, Rosebery (DE); Juan Felix Torres, Darlinghurst (AU); William Thomas Rowley, Glebe (AU); Ho Young Sung, Meadowbank (AU); Michael J. Smithers, Kareela (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 17/055,985

(22) PCT Filed: May 14, 2019

(86) PCT No.: PCT/US2019/032269
§ 371 (c)(1),
(2) Date: Nov. 16, 2020

(87) PCT Pub. No.: WO2019/222251
PCT Pub. Date: Nov. 21, 2019

(65) Prior Publication Data
US 2021/0211802 A1    Jul. 8, 2021

Related U.S. Application Data

(60) Provisional application No. 62/673,435, filed on May 18, 2018.

(30) Foreign Application Priority Data

May 18, 2018  (EP) .................................. 18173109

(51) Int. Cl.
| H04R 3/00 | (2006.01) |
| H03G 3/30 | (2006.01) |
| H03G 9/02 | (2006.01) |

(52) U.S. Cl.
CPC .......... *H04R 3/007* (2013.01); *H03G 3/3005* (2013.01); *H03G 9/025* (2013.01); *H04R 2430/01* (2013.01); *H04R 2430/03* (2013.01)

(58) Field of Classification Search
CPC ................ H04R 3/007; H04R 2430/01; H04R 2430/03; H04R 29/001; H04R 29/003; H03G 3/005; H03G 3/3005; H03G 9/025
(Continued)

(56) References Cited

U.S. PATENT DOCUMENTS

| 4,641,361 A | 2/1987 | Rosback |
| 5,548,650 A | 8/1996 | Clark |

(Continued)

FOREIGN PATENT DOCUMENTS

| CN | 103299655 | 9/2013 |
| CN | 105745943 | 7/2016 |

(Continued)

OTHER PUBLICATIONS

Luo, C. et al "A Model Based Excursion Protection Algorithm for Loudspeakers" IEEE International on Acoustics, Speech and Signal Processing, Kyoto, Mar. 2012, pp. 233-236.

*Primary Examiner* — Xu Mei

(57) ABSTRACT

An apparatus and method of excursion protection of a loudspeaker. The method includes attenuating selected bands in a transform domain, controlled by a feedback signal resulting from an excursion transfer function that has been modified according to the real-time operational characteristics of the loudspeaker. In this manner, the system reduces the amount of wideband attenuation needed to address the
(Continued)

predicted excursion, resulting in a better listening experience.

23 Claims, 5 Drawing Sheets

(58) Field of Classification Search
USPC .............................................. 381/55, 59, 96
See application file for complete search history.

(56) References Cited

U.S. PATENT DOCUMENTS

| | | | | |
|---|---|---|---|---|
| 6,201,873 | B1* | 3/2001 | Farra | H03G 3/32 |
| | | | | 381/100 |
| 6,865,274 | B1 | 3/2005 | Aarts | |
| 6,931,135 | B1 | 8/2005 | Kohut | |
| 7,274,793 | B2* | 9/2007 | Combest | H04R 3/002 |
| | | | | 381/55 |
| 8,351,621 | B2* | 1/2013 | Lehnert | H04R 3/007 |
| | | | | 381/106 |
| 8,798,281 | B2 | 8/2014 | Gautama | |
| 8,855,322 | B2* | 10/2014 | Ryu | H04R 3/007 |
| | | | | 381/55 |
| 8,942,381 | B2 | 1/2015 | Gautama | |
| 9,161,126 | B2 | 10/2015 | Su | |
| 9,258,659 | B2 | 2/2016 | Pan | |
| 9,264,829 | B2 | 2/2016 | Tsai | |
| 9,414,160 | B2 | 8/2016 | Van Schyndel | |
| 9,414,161 | B2 | 8/2016 | Van Schyndel | |
| 9,565,505 | B2 | 2/2017 | Ronig | |
| 9,578,416 | B2 | 2/2017 | Gautama | |
| 9,614,489 | B2 | 4/2017 | Cheng | |
| 9,942,657 | B2* | 4/2018 | Lawrence | H04R 3/04 |
| 9,967,663 | B2* | 5/2018 | Bjoern-Josefsen | H04R 29/001 |
| 10,674,263 | B1* | 6/2020 | Palit | H03G 3/005 |
| 2012/0281844 | A1 | 11/2012 | Luo | |
| 2013/0077795 | A1 | 3/2013 | Risbo | |
| 2013/0251164 | A1 | 9/2013 | Gautama | |
| 2014/0254805 | A1 | 9/2014 | Jie | |
| 2015/0010168 | A1* | 1/2015 | Cheng | H03G 9/025 |
| | | | | 381/107 |
| 2015/0124982 | A1 | 5/2015 | Spetzler | |
| 2015/0146875 | A1 | 5/2015 | Temujin | |
| 2016/0173983 | A1 | 6/2016 | Spetzler | |
| 2016/0373858 | A1 | 12/2016 | Lawrence | |
| 2017/0280240 | A1 | 9/2017 | Rong | |
| 2017/0347188 | A1 | 11/2017 | Jes | |

FOREIGN PATENT DOCUMENTS

| | | |
|---|---|---|
| EP | 3240302 | 11/2017 |
| TW | 201531112 | 8/2015 |

* cited by examiner

LOUDSPEAKER EXCURSION PROTECTION

CROSS REFERENCE TO RELATED APPLICATIONS

This application claims priority to U.S. Provisional Application No. 62/673,435, filed May 18, 2018 and European Patent Application No. 18173109.2, filed May 18, 2018, each of which is incorporated by reference in their entirety herein.

BACKGROUND

The present invention relates to loudspeaker excursion protection, and in particular, to excursion protection using a multiband compressor and a wideband limiter in a feedback configuration.

Unless otherwise indicated herein, the approaches described in this section are not prior art to the claims in this application and are not admitted to be prior art by inclusion in this section.

A loudspeaker produces sound by causing a diaphragm to move back and forth along an axis. There is a limit to how far from its resting position the diaphragm can move ("excurse") before it begins to stress the physical structure of the loudspeaker. If this limit is exceeded, it is known as "over-excursion", and it leads to long-term degradation of performance and eventual failure of the loudspeaker.

Because real-time direct measurement of excursion (e.g. via a laser) is costly in production loudspeakers, excursion protection algorithms tend to work by predicting excursion in some fashion from a candidate output audio signal. The candidate output audio is then modified such that the predicted excursion is constrained to some maximum.

With the approximation that a loudspeaker operates as a linear system, it is well understood how to predict excursion based on the audio signal and measurable characteristics of the loudspeaker and amplifier system. Some of these characteristics are more-or-less static throughout the lifespan of the loudspeaker and can be measured directly. Other characteristics may be measured indirectly, such as (if a "smart amp" is available) by measuring the voltage-to-current transfer function ("impedance") of the loudspeaker—it is important to note here that some of these characteristics do change over relatively short time periods, particularly as the speaker's voice coil heats up during use. It is also well understood that from these characteristics can be derived a voltage-to-excursion transfer function, i.e. a value in meters/Volt across the operating frequency range of the speaker.

In general, solutions to limit excursion operate using one or more of the following features. One feature is applying a wideband gain to the candidate output audio signal after excursion has been predicted. A second feature is transforming the candidate output audio signal into an excursion signal, applying a wideband gain to limit this signal, then transforming this signal back into the final output audio signal. A third feature is using an adaptive crossover with different gains applied to low and high frequencies (i.e. a dual-band approach), controlled by the predicted excursion. A fourth feature is using a multiband compressor to assist excursion limiting.

For example, U.S. Application Pub. No. 2012/0281844 discusses excursion protection through wideband limiting. U.S. Application Pub. No. 2013/0077795 discusses excursion protection using compression of low frequencies. However, it operates according to a pre-determined power limit, and is not necessarily responsive to the real-time characteristics of the loudspeaker.

U.S. Pat. No. 6,931,135 discusses excursion protection using compression of low frequencies with a feedback loop in the servo mechanism. However, it operates according to a pre-determined voltage level, and is not necessarily responsive to the real-time characteristics of the loudspeaker.

U.S. Pat. No. 6,865,274 discusses a multiband compressor including controllable thresholds. However, it does not appear to mention an attenuation feedback system.

U.S. Pat. No. 5,548,650 discusses excursion-controlled filters that drive excursion limiting. However, the filter for excursion appears to use a static model that does not adjust to the real-time characteristics of the speaker.

In summary, wideband limiting has many well-known problems such as volume "pumping", loss of bass response, and general distortion of timbre. Multiband compression, if done well, alleviates these problems to some extent, usually trading them off against each other in some way. However, for many existing multiband compressor designs, each band's compressor thresholds must be explicitly calibrated by some process prior to system operation, and do not adapt to real-time changes in system state. Further, no existing systems suggest how to use the voltage-to-excursion transfer function in real-time to help calibrate a multiband compressor.

SUMMARY

Given the above, there is a need for excursion protection that accounts for the real-time operation of a loudspeaker. An embodiment is directed to an excursion protection system that uses a feedback signal to perform compression on selected bands in a transform domain.

According to an embodiment, an apparatus performs excursion protection of a loudspeaker. The apparatus includes a first transformer, an excursion transfer function estimator, a multiband compressor, an amplifier, a second transformer, an excursion predictor, and an attenuator. The first transformer is configured to transform a first audio signal into a second audio signal. The first audio signal is in a time domain, the second audio signal is in a transform domain other than the time domain, and the second audio signal has a plurality of bands. The excursion transfer function estimator is configured to estimate an excursion transfer function of the loudspeaker based on information related to driving the loudspeaker. The multiband compressor is configured to generate a plurality of gains for a subset of the plurality of bands of the second audio signal based on the excursion transfer function. The multiband compressor is controlled by a feedback signal. The amplifier is configured to generate a third audio signal by applying the plurality of gains to the subset of the plurality of bands of the second audio signal. The second transformer is configured to transform the third audio signal into a fourth audio signal in the time domain. The excursion predictor is configured to generate a predicted excursion of the loudspeaker based on the excursion transfer function and the fourth audio signal. The attenuator is configured to generate a fifth audio signal by attenuating the fourth audio signal by an attenuation value according to the predicted excursion. The feedback signal corresponds to the attenuation value, and the fifth audio signal is provided to the loudspeaker.

The transform domain may be a discrete Fourier transform (DFT) filterbank domain, where the plurality of bands is 77 non-uniform bands.

The excursion transfer function estimator may be configured to store a stored excursion transfer function, and the excursion transfer function estimator may be configured to generate the excursion transfer function by modifying the stored excursion transfer function according to the information related to driving the loudspeaker. The information related to driving the loudspeaker may include voltage information and current information related to the fifth audio signal.

The multiband compressor may further include a filter that is configured to perform equivalent rectangular bandwidth (ERB) banding on the second audio signal to generate the plurality of bands.

The excursion predictor may further include a signal converter that is configured to convert the fourth audio signal into a voltage level, and the excursion predictor may be configured to generate the predicted excursion based on the voltage level applied to the excursion transfer function.

The attenuator may further include an excursion limiter and an audio limiter. The excursion limiter may be configured to generate an excursion attenuation based on the predicted excursion and an excursion limit. The audio limiter may be configured to generate an audio attenuation based on the fourth audio signal and an audio limit. The attenuator may be configured to attenuate the fourth audio signal based on a maximum of the excursion attenuation and the audio attenuation, where the feedback signal corresponds to the maximum of the excursion attenuation and the audio attenuation.

The multiband compressor may include a signal converter, a second excursion predictor, a third transformer, a first filter, a first multiband compressor, a second filter, a second multiband compressor, and a selector. The signal converter may be configured to convert the first audio signal into a voltage level. The second excursion predictor may be configured to generate a second predicted excursion based on the voltage level applied to the excursion transfer function. The third transformer may be configured to transform the second predicted excursion into a sixth audio signal, where the sixth audio signal is in the transform domain. The first filter may be configured to perform equivalent rectangular bandwidth (ERB) banding on the sixth audio signal to generate a first plurality of bands. The first multiband compressor may be configured to generate a first plurality of gains for a subset of the first plurality of bands of the sixth audio signal based on a first feedback signal. The second filter may be configured to perform ERB banding on the second audio signal to generate a second plurality of bands. The second multiband compressor may be configured to generate a second plurality of gains for a subset of the second plurality of bands of the second audio signal based on a second feedback signal. The selector may be configured to generate the plurality of gains for the subset of the plurality of bands of the second audio signal by selecting a gain for each band from a maximum attenuation of the first plurality of gains and the second plurality of gains. The feedback signal may comprise the first feedback signal and the second feedback signal.

The attenuator may further include an excursion limiter and an audio limiter. The excursion limiter may be configured to generate an excursion attenuation based on the predicted excursion and an excursion limit, and to provide the excursion attenuation to the first multiband compressor as the first feedback signal. The audio limiter may be configured to generate an audio attenuation based on the fourth audio signal and an audio limit, and to provide the audio attenuation to the second multiband compressor as the second feedback signal. The attenuator may be configured to attenuate the fourth audio signal based on a maximum of the excursion attenuation and the audio attenuation.

The apparatus may further include a connected loudspeaker (corresponding to the loudspeaker), and an amplifier that is configured to receive the fifth audio signal and to control the connected loudspeaker to output an audible signal corresponding to the fifth audio signal. The amplifier may be configured to provide the information related to driving the connected loudspeaker to the excursion transfer function estimator. The information related to driving the connected loudspeaker may correspond to voltage information and current information that results from the connected loudspeaker outputting the audible signal corresponding to the fifth audio signal.

The apparatus may further include a laser that measures an actual excursion of the loudspeaker. The attenuator may be configured to generate the fifth audio signal by attenuating the fourth audio signal by the attenuation value according to the predicted excursion and the actual excursion.

According to another embodiment, a method performs excursion protection of a loudspeaker. The method includes transforming a first audio signal into a second audio signal. The first audio signal is in a time domain, the second audio signal is in a transform domain other than the time domain, and the second audio signal has a plurality of bands. The method further includes generating an excursion transfer function of the loudspeaker based on information related to driving the loudspeaker. The method further includes generating a plurality of gains for a subset of the plurality of bands of the second audio signal based on the excursion transfer function, where generating the plurality of gains is controlled by a feedback signal. The method further includes generating a third audio signal by applying the plurality of gains to the subset of the plurality of bands of the second audio signal. The method further includes transforming the third audio signal into a fourth audio signal, where the fourth audio signal is in the time domain. The method further includes generating a predicted excursion of the loudspeaker based on the excursion transfer function and the fourth audio signal. The method further includes generating a fifth audio signal by attenuating the fourth audio signal by an attenuation value according to the predicted excursion, where the feedback signal corresponds to the attenuation value, and where the fifth audio signal is provided to the loudspeaker.

The method may further include outputting, from the loudspeaker, an audible signal corresponding to the fifth audio signal, where the information related to driving the loudspeaker is generated in accordance with outputting the audible signal.

The method may include similar details to those discussed above regarding the apparatus.

According to another embodiment, a non-transitory computer readable medium stores a computer program that, when executed by a processor, controls an apparatus to execute processing including one or more of the methods discussed above.

The following detailed description and accompanying drawings provide a further understanding of the nature and advantages of various implementations.

DETAILED DESCRIPTION

Described herein are techniques for excursion protection of loudspeakers. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

In the following description, various methods, processes and procedures are detailed. Although particular steps may be described in a certain order, such order is mainly for convenience and clarity. A particular step may be repeated more than once, may occur before or after other steps (even if those steps are otherwise described in another order), and may occur in parallel with other steps. A second step is required to follow a first step only when the first step must be completed before the second step is begun. Such a situation will be specifically pointed out when not clear from the context.

In this document, the terms "and", "or" and "and/or" are used. Such terms are to be read as having an inclusive meaning. For example, "A and B" may mean at least the following: "both A and B", "at least both A and B". As another example, "A or B" may mean at least the following: "at least A", "at least B", "both A and B", "at least both A and B". As another example, "A and/or B" may mean at least the following: "A and B", "A or B". When an exclusive-or is intended, such will be specifically noted (e.g., "either A or B", "at most one of A and B").

Figure 1:
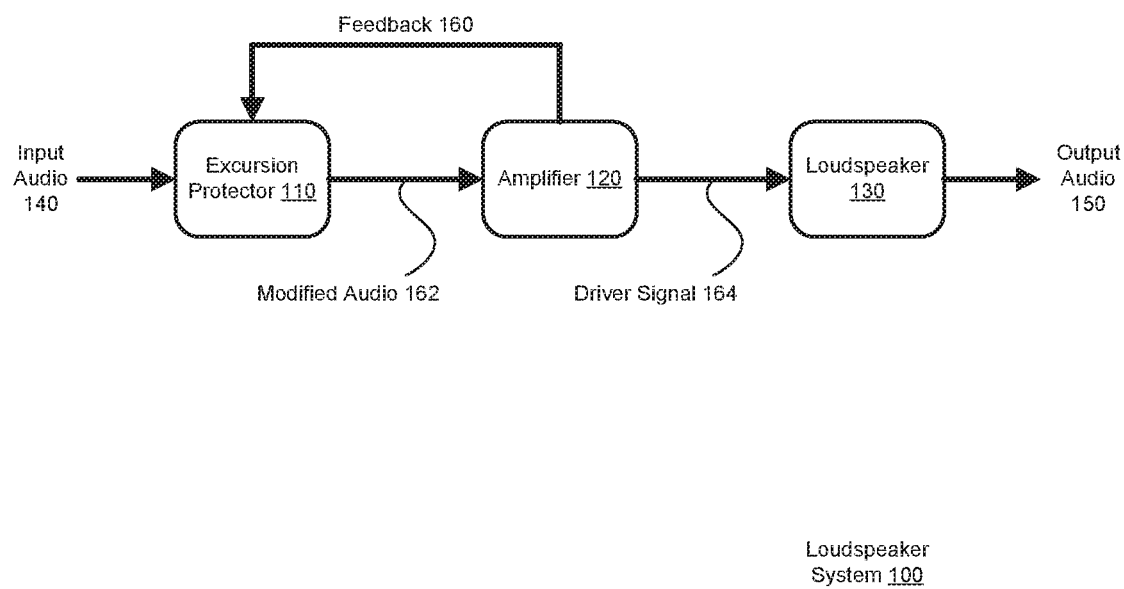
FIG. 1 is a block diagram of a loudspeaker system 100.

FIG. 1 is a block diagram of a loudspeaker system 100. The loudspeaker system 100 includes an excursion protector 110, an amplifier 120, and a loudspeaker 130. The loudspeaker system 100 receives an input audio signal 140 and generates an output audio signal 150. The input audio signal 140 may be a time-domain signal, such as a pulse-code modulation (PCM) signal (e.g., two channels, each sampled at 48 kHz and 24 bits per sample). The output audio signal 150 generally corresponds to an audible signal (e.g., sound). The loudspeaker system 100 may be part of another device that includes the loudspeaker 130, such as a portable computer, a mobile telephone, a headset, a television, a portable radio, a media player, a sound bar, etc. The loudspeaker system 100 may be in the form factor of a single device that includes the other components. The loudspeaker system 100 may be in the form factor of multiple devices, e.g., with the excursion protector 110 and amplifier 120 in a first device, and the loudspeaker 130 in a second device, connected by a speaker wire.

The excursion protector 110 receives the input audio signal 140 and a feedback signal 160 from the amplifier 120, performs excursion protection on the input audio signal 140 according to the feedback signal 160, and generates a modified audio signal 162. The excursion protector 110 may be implemented by a processor that is configured to execute an excursion protection process. In general, the excursion protector 110 applies the feedback signal 160 to a stored excursion model of the loudspeaker 130, in order to adjust frequency bands of the input audio signal 140 on a real-time basis. Further details of the excursion protector 110, including details for the excursion protection process and the feedback signal 160, are provided below.

The amplifier 120 receives the modified audio signal 162 from the excursion protector 110 and generates a driver signal 164, corresponding to the modified audio signal 162, to drive the loudspeaker 130. In general, the driver signal 164 is a time-domain signal having a voltage and a current. The amplifier 120 also generates the feedback signal 160 for the excursion protector 110. In general, the feedback signal 160 is related to the voltage and current of the driver signal 164 generated by the amplifier 120, thereby providing real-time feedback of the operational parameters of the loudspeaker 130 to the excursion protector 110.

The loudspeaker 130 receives the driver signal 164 and, in response thereto, generates the output audio signal 150, e.g. as sound waves.

The arrangements and quantities of the components shown in FIG. 1 may be adjusted as desired. For example, the loudspeaker system 100 may include more than one amplifier 120, more than one loudspeaker 130, etc. For variations with multiple amplifiers or multiple loudspeakers, the excursion protector 110 may receive more than one feedback signal 160, and may generate more than one modified audio signal 162.

Figure 2:
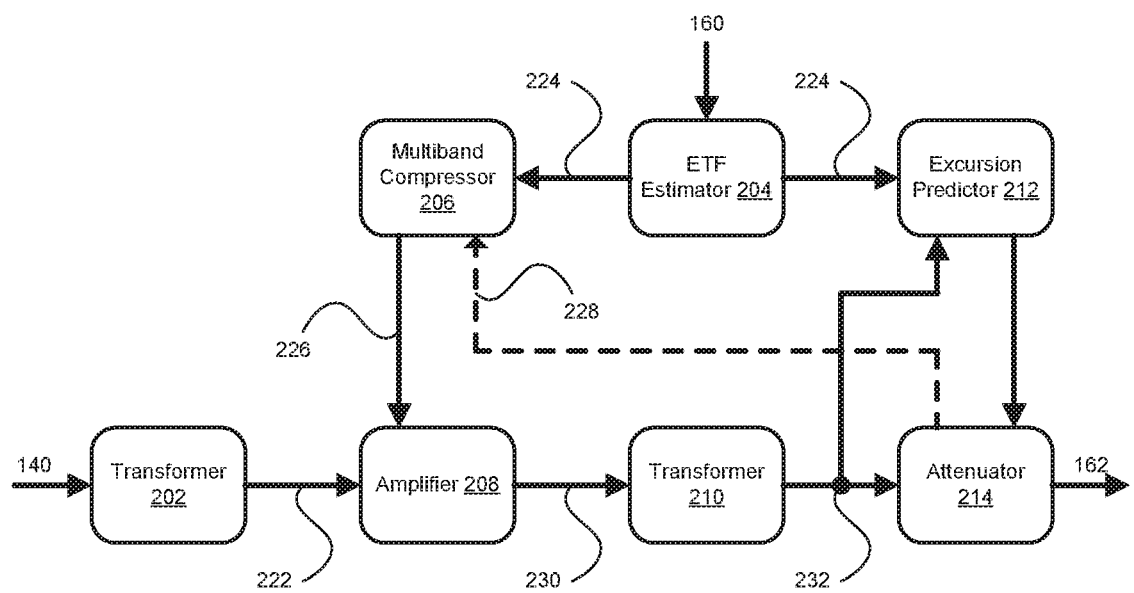
FIG. 2 is a block diagram showing additional details of the excursion protector 110 (see FIG. 1).

FIG. 2 is a block diagram showing additional details of the excursion protector 110 (see FIG. 1). The excursion protector 110 includes a transformer 202, an excursion transfer function (ETF) estimator 204, a multiband compressor 206, an amplifier 208, a transformer 210, an excursion predictor 212, and an attenuator 214. One or more of the components of the excursion protector 110 may be implemented by a processor and a memory, e.g. according to one or more computer programs stored by the memory and executed by the processor.

The transformer 202 receives the input audio signal 140 (see FIG. 1), transforms the input audio signal 140 in a transform domain, and generates a transform domain signal 222. For example, the input audio signal 140 may be in the time domain, and the transform domain signal 222 may be in the frequency domain, the discrete Fourier transform (DFT) filterbank domain, the quadrature mirror filter (QMF) domain, the complex QMF (CQMF) domain, etc. As discussed in more detail below, the transformer 202 may transform the input audio signal 140 into the hybrid CQMF (HCQMF) domain.

The excursion transfer function estimator 204 receives the feedback signal 160 from the amplifier 120 (see FIG. 1) and generates an excursion transfer function 224 of the loudspeaker 130 (see FIG. 1) by applying the feedback signal 160 to an excursion model of the loudspeaker 130 stored by the excursion transfer function estimator 204. In general, the stored excursion model models the loudspeaker 130 over a variety of operating conditions; the feedback signal 160 captures the operating conditions in real time, which enables the excursion transfer function estimator 204 to generate the excursion transfer function 224 such that it most closely models the loudspeaker 130 in real time. For example, and as further discussed below, the feedback signal 160 may include voltage and current information of the loudspeaker 130, which result in the excursion transfer function 224 taking into account the real time impedance of the loudspeaker 130. Further details of the excursion transfer function 224 are provided below.

The multiband compressor 206 generates a set of gains 226, based on the excursion transfer function 224 generated by the excursion transfer function estimator 204, as controlled by a feedback signal 228 from the attenuator 214. In general, each gain in the set of gains 226 is applicable to a particular band in the transform domain. In general, the feedback signal 228 controls which bands in the transform domain are to be compressed, and the amount of compression to be applied. Further details of the set of gains 226, and the feedback signal 228, are provided below.

In general, the multiband compressor 206 may be configured to attenuate bands that are more responsible for the excursion. The multiband compressor 206 may perform this attenuation in a way that preserves the timbre of the input audio signal 140.

The amplifier 208 applies the set of gains 226 generated by the multiband compressor 206 to the transform domain signal 222, and generates a modified transform domain signal 230. For example, if the set of gains 226 indicates that a particular band is contributing to excursion of the loudspeaker 130, the amplifier 208 generates the modified transform domain signal 230 such that the gain of that particular band is reduced.

The transformer 210 generates an audio signal 232 by transforming the modified transform domain signal 230 from the transform domain back to the original domain of the input audio signal 140. This transformation may also be referred to as an inverse transformation. For example, when the input audio signal 140 is in the time domain, and the modified transform domain signal 230 is in the HCQMF domain, the transformer 210 generates the audio signal 232 in the time domain.

The excursion predictor 212 generates a predicted excursion 234 (of the loudspeaker 130) based on the excursion transfer function 224 and the audio signal 232. For example, the predicted excursion 234 may correspond to a distance in millimeters that the loudspeaker is predicted to excurse, in response to the audio signal 232, as applied to the excursion transfer function 224.

The attenuator 214 generates the modified audio signal 162 (see FIG. 1) by attenuating the audio signal 232 by an attenuation value according to the predicted excursion 234. For example, the attenuator 214 may store a lookup table of values of the predicted excursion 234, and corresponding attenuation values (in dB) to be applied to the modified audio signal 162. The attenuator 214 then provides the attenuation value to the multiband compressor 206 as the feedback signal 228. In this manner, the set of gains 226 generated by the multiband compressor 206 can be applied prospectively to the bands of interest of the input audio signal 140 (by the amplifier 208), causing the excursion predictor 212 to predict less excursion of the loudspeaker 130 for the audio signal 232, thereby reducing the need for the attenuator 214 to attenuate the audio signal 232.

Figure 3:
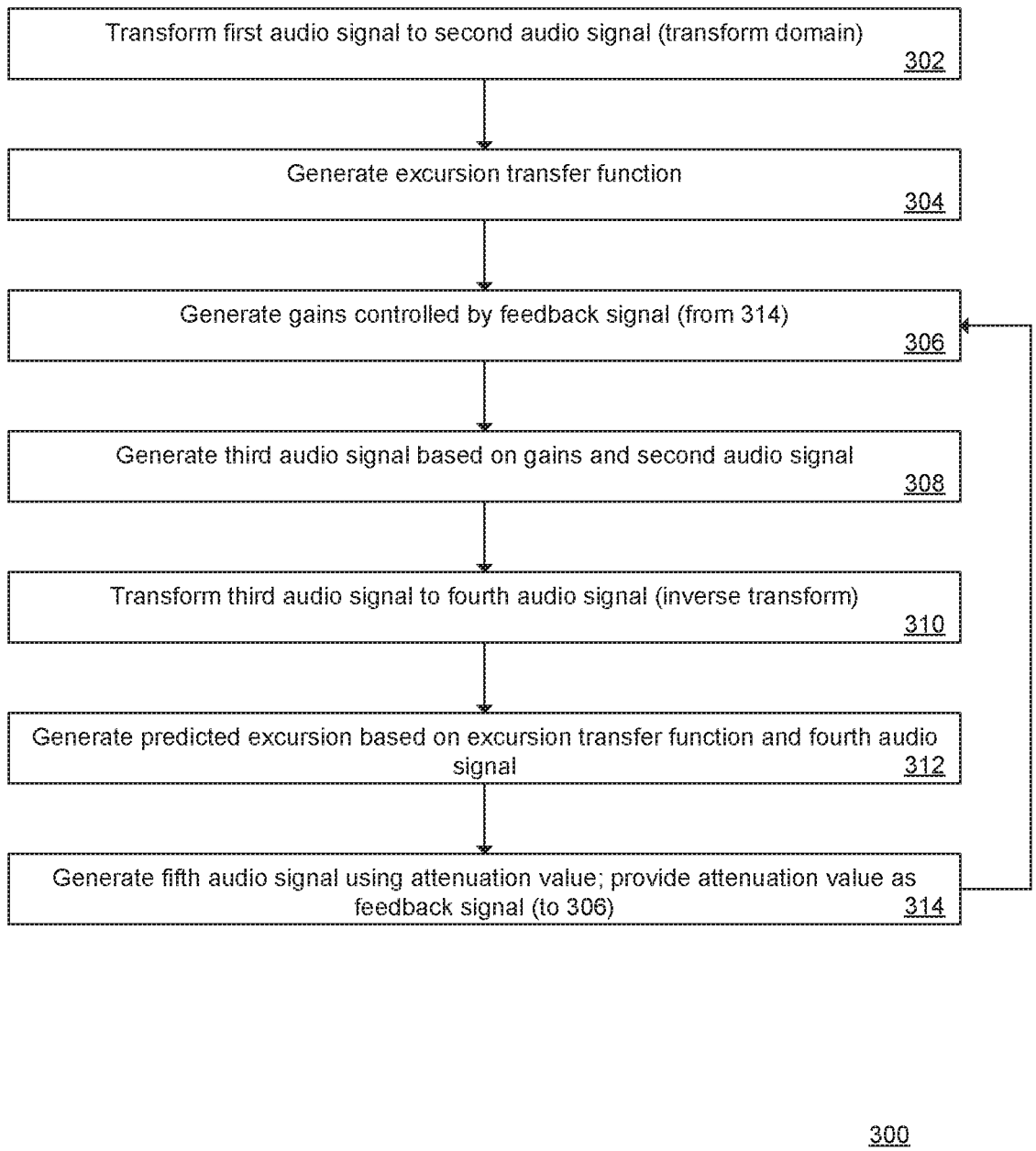
FIG. 3 is a flowchart of a method 300 of excursion protection of a loudspeaker.

FIG. 3 is a flowchart of a method 300 of excursion protection of a loudspeaker. The method 300 may be performed by the excursion protector 110 (see FIG. 2) as implemented by a processor, for example by executing one or more computer programs, to control excursion protection of the loudspeaker 130 (see FIG. 1).

At 302, a first audio signal is transformed into a second audio signal. The first audio signal is in a time domain, and the second audio signal is in a transform domain other than the time domain. The second audio signal has a number of bands. For example, the transformer 202 (see FIG. 2) may transform the input audio signal 140 from the time domain into the HCQMF domain.

At 304, an excursion transfer function of the loudspeaker is generated based on information related to driving the loudspeaker. For example, the excursion transfer function estimator 204 (see FIG. 2) may store an excursion model of the loudspeaker 130, and may generate the excursion transfer function 224 by applying the feedback signal 160 (see FIGS. 1-2) to the excursion model.

At 306, a plurality of gains for a subset of the plurality of bands of the second audio signal are generated based on the excursion transfer function, where generating the plurality of gains is controlled by a feedback signal. For example, the multiband compressor 206 (see FIG. 2) may generate the gains 226 based on the excursion transfer function 224, as controlled by the feedback signal 228.

At 308, a third audio signal is generated by applying the plurality of gains to the subset of the plurality of bands of the second audio signal. For example, the amplifier 208 (see FIG. 2) may apply the gains 226 to the transform domain signal 222, to generate the modified transform domain signal 230.

At 310, the third audio signal is transformed into a fourth audio signal, where the fourth audio signal is in the time domain. For example, the transformer 210 (see FIG. 2) may perform inverse transformation on the modified transform domain signal 230 to transform it back into the time domain, resulting in the audio signal 232.

At 312, a predicted excursion of the loudspeaker is generated based on the excursion transfer function and the fourth audio signal. For example, the excursion predictor 212 (see FIG. 2) may generate the predicted excursion 234 by using the audio signal 232 as an input to the excursion transfer function 224.

At 314, a fifth audio signal is generated by attenuating the fourth audio signal by an attenuation value according to the predicted excursion; this attenuation may be a wideband attenuation. The feedback signal corresponds to the attenuation value and is provided back to 306; the fifth audio signal is provided to the loudspeaker. For example, the attenuator 214 (see FIG. 2) may generate the modified audio signal 162 (see FIGS. 1-2) by attenuating the audio signal 232 by an attenuation value according to the predicted excursion 234; the attenuator 214 may also provide the attenuation value to the multiband compressor 206 as the feedback signal 228; and the attenuator 214 may provide the modified audio signal 162 to the loudspeaker 130 (see FIG. 1).

Since the gains are applied in the transform domain (see 306 and 308), as controlled by the feedback signal (see 314), the need for wideband attenuation at the end of the process (see 314) is reduced. This results in a better listening experience.

Figure 4:
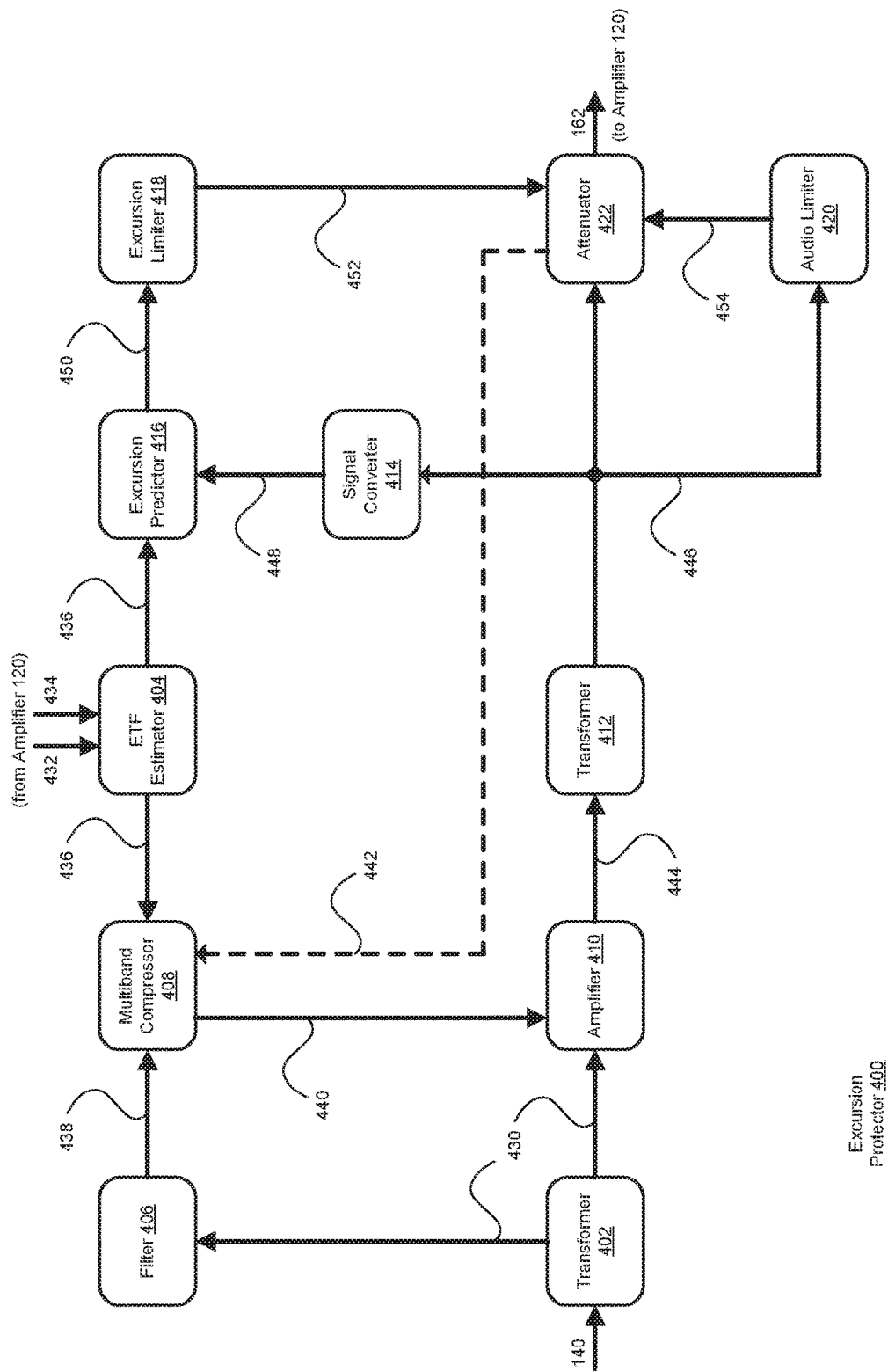
FIG. 4 is a block diagram of an excursion protector 400.

FIG. 4 is a block diagram of an excursion protector 400. The excursion protector 400 is similar to the excursion protector 110 (see FIGS. 1-2), and includes additional details. The excursion protector 400 includes a transformer 402, an excursion transfer function (ETF) estimator 404, a filter 406, a multiband compressor 408, an amplifier 410, a transformer 412, a signal converter 414, an excursion predictor 416, an excursion limiter 418, an audio limiter 420, and an attenuator 422. One or more of the components of the excursion protector 400 may be implemented by a processor and a memory, e.g. according to one or more computer programs stored by the memory and executed by the processor. The excursion protector 400 may operate according to a method similar to the method 300 (see FIG. 3), with the additional operational details discussed below.

The transformer 402 receives the input audio signal 140 (see FIGS. 1-2), transforms the input audio signal 140 in a transform domain, and generates a transform domain signal 430. As discussed above, the input audio signal 140 may be a PCM signal in the time domain, and the transformer 402 may perform the transform into the HCQMF domain.

In general, QMF domain information is generated by a filter whose frequency response is the mirror image around π/2 of that of another filter; together these filters are known as the QMF pair. In general, "CQMF" domain information results from a complex-modulated DFT filter bank applied to a time-domain signal. In general, "HCQMF" domain information corresponds to CQMF domain information in which the CQMF filter bank has been extended to a hybrid structure to obtain an efficient non-uniform frequency resolution that matches the frequency resolution of the human auditory system. According to a specific HCQMF implementation, the HCQMF information is generated into 77 frequency bands, where the lower CQMF sub-bands are further split in order to obtain a higher frequency resolution for the lower frequencies. According to a further specific implementation, the transformer 402 transforms each channel of the input audio signal 140 into 64 CQMF sub-bands, and further divides the lowest 3 sub-bands into sub-sub-bands as follows: the first sub-band is divided into 8 sub-sub-bands, the second and third sub-bands are each divided into 4 sub-sub-bands. (This hybrid splitting of the lowest sub-bands is to improve the low-frequency resolution of these sub-bands.)

(Note that the terms QMF, CQMF and HCQMF are used a bit colloquially herein. Specifically, the terms QMF/CQMF may be used colloquially to refer to a DFT (discrete Fourier transform) filterbank that may include more than two subbands. The term HCQMF may be used colloquially to refer to a non-uniform DFT filterbank that may include more than two subbands.)

The excursion transfer function estimator 404 receives a voltage feedback signal 432 and a current feedback signal 434 from the amplifier 120 (see FIG. 1) and generates an excursion transfer function 436 of the loudspeaker 130 (see FIG. 1) by applying the voltage feedback signal 432 and the current feedback signal 434 to an excursion model of the loudspeaker 130 stored by the excursion transfer function estimator 404. The voltage feedback signal 432 and the current feedback signal 434 together correspond to the feedback signal 160 (see FIGS. 1-2). As discussed above, the voltage feedback signal 432 and the current feedback signal 434 reflect the real-time impedance of the loudspeaker 130, allowing the excursion transfer function estimator 404 to generate the excursion transfer function 436 such that it accounts for the real-time impedance of the loudspeaker 130. As a result, the excursion transfer function 436 adapts to the characteristics of the loudspeaker 130 as they vary over the lifecycle of the loudspeaker 130. For example, the loudspeaker 130 may have a first set of characteristics early in its lifecycle (e.g., when it is manufactured or installed), a second set of characteristics through the middle of its lifecycle, and third set of characteristics if a traumatic event occurs (e.g., the device is dropped), a fourth set of characteristics at the end of its lifecycle (e.g., just before failure), etc. The real-time impedance also reflects other real-time operational characteristics such as temperature as they vary during operation of the loudspeaker 130.

The filter 406 performs banding of the transform domain signal 430 to generate a banded signal 438. The banding performed by the filter 406 may correspond to equivalent rectangular bandwidth (ERB) bands. ERB banding maps to a psychoacoustic filtering process of the transform domain signal 430 according to an approximation of the bandwidths of the filters in the human auditory system. In general, the banded signal 438 corresponds to 20 ERB bands of the transform domain signal 430.

The multiband compressor 408 generates a set of gains 440, that may be modified according to the excursion transfer function 436 (generated by the excursion transfer function estimator 404), to the banded signal 438, as controlled by a feedback signal 442 from the attenuator 422. In general, the greater the level of attenuation indicated by the feedback signal 442, the greater the level of attenuation prescribed by the set of gains 440. In this manner, the feedback signal 442 controls which bands in the transform domain are to be compressed, and the amount of compression to be applied to each band.

The amplifier 410 applies the set of gains 440 generated by the multiband compressor 408 to the transform domain signal 430, and generates a modified transform domain signal 444. For example, if the set of gains 440 indicates that a particular band is contributing to excursion of the loudspeaker 130, the amplifier 410 generates the modified transform domain signal 444 such that the gain of that particular band is reduced.

The transformer 412 generates an audio signal 446 by transforming the modified transform domain signal 444 from the transform domain back to the original domain of the input audio signal 140 (e.g., an inverse transform). For example, when the input audio signal 140 is in the time domain, and the modified transform domain signal 444 is in the HCQMF domain, the transformer 412 generates the audio signal 446 in the time domain. As a further example, when the input audio signal 140 is a PCM signal, the audio signal 446 is a PCM signal.

The signal converter 414 converts the audio signal 446 to a voltage level 448. In general, the signal converter 414 simulates the amplifier 120 (see FIG. 1), so that the voltage level 448 of the audio signal 446 corresponds to the voltage the amplifier 120 would generate in response to a similar input signal.

The excursion predictor 416 generates a predicted excursion 450 (of the loudspeaker 130) based on the excursion transfer function 436 applied to the voltage level 448. For example, the predicted excursion 450 may correspond to a distance in millimeters that the loudspeaker 130 is predicted to excurse, in response to the voltage level 448 (of the audio signal 446).

The excursion limiter 418 generates an attenuation 452 that depends on an amount by which the predicted excursion 450 exceeds an excursion limit. For example, if the predicted excursion 450 is 0.2 millimeters and the excursion limit is 0.1 millimeters, the attenuation 452 is 2.0 (a gain of 0.5). The excursion limit may be adjusted as desired according to the characteristics of the loudspeaker 130 (see FIG. 1). The attenuation 452 may also be referred to as the excursion attenuation.

The audio limiter 420 generates an attenuation 454 that depends on an amount by which the audio signal 446 exceeds an audio limit. For example, if the level of the audio signal 446 is −6 dBFS (decibels relative to full scale) and the audio limit is −9 dBFS, the attenuation 454 is 3 dB. The audio limit may be adjusted as desired according to the characteristics of the loudspeaker 130 (see FIG. 1). The attenuation 454 may also be referred to as the audio attenuation.

The attenuator 422 generates the modified audio signal 162 (see FIG. 1) by applying, to the audio signal 446, an attenuation value corresponding to the maximum of the attenuation 452 and the attenuation 454. (The attenuator 422 may operate as a wideband attenuator, applying the attenuation value to all bands of the audio signal 446.) In this manner, the attenuator 422 performs attenuation on the audio signal 446 so that neither the excursion limit nor the audio limit is exceeded. The attenuator 422 then provides the attenuation value to the multiband compressor 408 as the feedback signal 442. In this manner, the set of gains 440 generated by the multiband compressor 408 can be applied prospectively to the bands of interest of the input audio signal 140 (by the amplifier 410), causing the excursion predictor 416 to predict less excursion of the loudspeaker 130 for the audio signal 446, thereby reducing the need for the attenuator 422 itself to attenuate the audio signal 446.

As mentioned above, the excursion protector 400 is similar to the excursion protector 110 (see FIGS. 1-2), and may be used in place of the excursion protector 110 in the loudspeaker system 100 of FIG. 1. In general, the components of the excursion protector 400 correspond to the components of the excursion protector 110. More specifically, the filter 406 and the multiband compressor 408 (see FIG. 4) provide more detail to the multiband compressor 206 (see FIG. 2); the voltage feedback signal 432 and the current feedback signal 434 provide more detail to the feedback signal 160; the signal converter 414 and the excursion predictor 416 provide more detail to the excursion predictor 212; and the excursion limiter 418, the audio limiter 420 and the attenuator 422 provide more detail to the attenuator 214.

Figure 5:
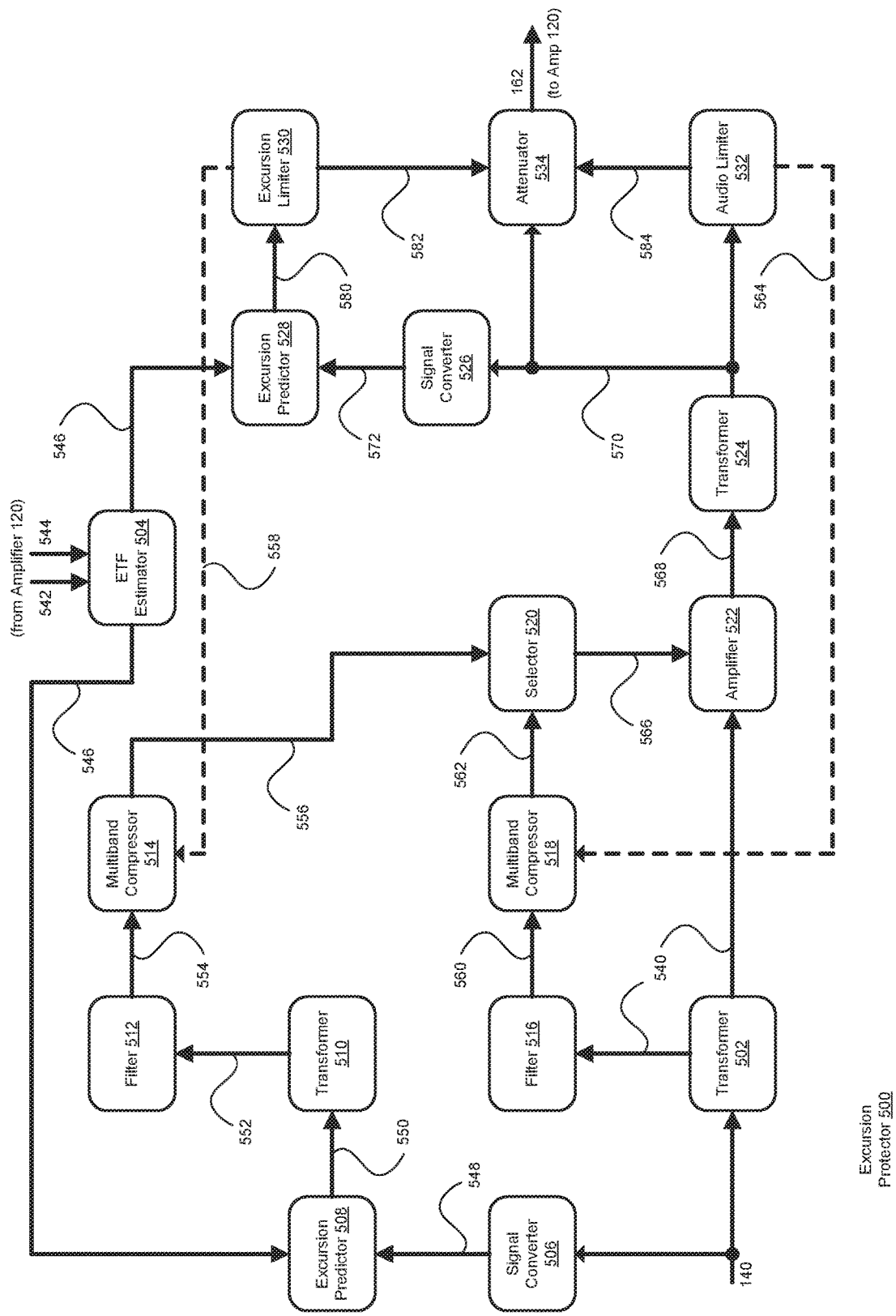
FIG. 5 is a block diagram of an excursion protector 500.

FIG. 5 is a block diagram of an excursion protector 500. The excursion protector 500 is similar to the excursion protector 110 (see FIGS. 1-2), and includes additional details. The excursion protector 500 is also similar to the excursion protector 400 (see FIG. 4). A noteworthy difference from the excursion protector 400 (see FIG. 4) is that the excursion protector 500 uses two internal feedback signals, as further discussed below.

The excursion protector 500 includes a transformer 502, an excursion transfer function (ETF) estimator 504, a signal converter 506, an excursion predictor 508, a transformer 510, a filter 512, a multiband compressor 514, a filter 516, a multiband compressor 518, a selector 520, an amplifier 522, a transformer 524, a signal converter 526, an excursion predictor 528, an excursion limiter 530, an audio limiter 532, and an attenuator 534. One or more of the components of the excursion protector 500 may be implemented by a processor and a memory, e.g. according to one or more computer programs stored by the memory and executed by the processor. The excursion protector 500 may operate according to a method similar to the method 300 (see FIG. 3), with the additional operational details discussed below.

The transformer 502 receives the input audio signal 140 (see FIGS. 1-2), transforms the input audio signal 140 in a transform domain, and generates a transform domain signal 540. As discussed above, the input audio signal 140 may be a PCM signal in the time domain, and the transformer 502 may perform the transform into the HCQMF domain (as with the transformer 402 of FIG. 4).

The excursion transfer function estimator 504 receives a voltage feedback signal 542 and a current feedback signal 544 from the amplifier 120 (see FIG. 1) and generates an excursion transfer function 546 of the loudspeaker 130 (see FIG. 1) by applying the voltage feedback signal 542 and the current feedback signal 544 to an excursion model of the loudspeaker 130 stored by the excursion transfer function estimator 504. The voltage feedback signal 542 and the current feedback signal 544 together correspond to the feedback signal 160 (see FIGS. 1-2). As discussed above, the voltage feedback signal 542 and the current feedback signal 544 reflect the real-time impedance of the loudspeaker 130, allowing the excursion transfer function estimator 504 to generate the excursion transfer function 546 such that it accounts for the real-time impedance of the loudspeaker 130. As a result, the excursion transfer function 546 adapts to the characteristics of the loudspeaker 130 as they vary over the lifecycle of the loudspeaker 130.

The signal converter 506 converts the input audio signal 140 to a voltage level 548. In general, the signal converter 506 simulates the amplifier 120 (see FIG. 1), so that the voltage level 548 of the input audio signal 140 corresponds to the voltage the amplifier 120 would generate in response to a similar input signal.

The excursion predictor 508 generates a predicted excursion 550 (of the loudspeaker 130) based on the excursion transfer function 546 applied to the voltage level 548. For example, the predicted excursion 550 may correspond to a distance in millimeters that the loudspeaker 130 is predicted to excurse, in response to the voltage level 548 (of the input audio signal 140). The voltage level 548, and the predicted excursion 550, are in the same domain as the input audio signal 140 (e.g., the time domain).

The transformer 510 transforms the predicted excursion 550 in a transform domain and generates a transform domain signal 552. As discussed above, the predicted excursion 550 may be in the time domain, and the transformer 502 may perform the transform into the HCQMF domain (as with the transformer 402 of FIG. 4).

The filter 512 performs banding of the transform domain signal 552 to generate a banded signal 554. The banding performed by the filter 512 may correspond to ERB banding, as discussed above regarding the filter 406 (see FIG. 4).

The multiband compressor 514 generates a set of gains 556 based on the banded signal 554, as controlled by a feedback signal 558 from the excursion limiter 530. In general, the greater the level of attenuation indicated by the feedback signal 558, the greater the level of attenuation prescribed by the set of gains 556. In this manner, the feedback signal 558 controls which bands in the transform domain are to be compressed, and the amount of compression to be applied to each band. Note that the set of gains 556 is based on the transform of the predicted excursion 550. (In FIG. 4, the set of gains 440 is less directly based on the predicted excursion 450.)

The filter 516 performs banding of the transform domain signal 540 to generate a banded signal 560. The banding performed by the filter 516 may correspond to ERB banding, as discussed above regarding the filter 512.

The multiband compressor 518 generates a set of gains 562 based on the banded signal 560, as controlled by a feedback signal 564 from the audio limiter 532. In general, the greater the level of attenuation indicated by the feedback signal 564, the greater the level of attenuation prescribed by the set of gains 562. In this manner, the feedback signal 564 controls which bands in the transform domain are to be compressed, and the amount of compression to be applied to each band. Note that the set of gains 562 is controlled based the feedback signal 564 from the audio limiter 532, whereas the set of gains 440 (see FIG. 4) is controlled by the feedback signal 442 from the attenuator 422.

The selector 520 selects, from the set of gains 556 and the set of gains 562, the gain corresponding to the maximum attenuation for each band, and provides these as a set of gains 566 to the amplifier 522.

The amplifier 522 applies the set of gains 566 (the maximum attenuation for each band in the set of gains 556 and the set of gains 562) to the transform domain signal 540, and generates a modified transform domain signal 568. For example, if the set of gains 566 indicates that a particular band is contributing to excursion of the loudspeaker 130, the amplifier 522 generates the modified transform domain signal 568 such that the gain of that particular band is reduced.

The transformer 524 generates an audio signal 570 by transforming the modified transform domain signal 568 from the transform domain back to the original domain of the input audio signal 140 (e.g., an inverse transform). For example, when the input audio signal 140 is in the time domain, and the modified transform domain signal 568 is in the HCQMF domain, the transformer 524 generates the audio signal 570 in the time domain. As a further example, when the input audio signal 140 is a PCM signal, the audio signal 570 is a PCM signal.

The signal converter 526 converts the audio signal 570 to a voltage level 572. In general, the signal converter 526 simulates the amplifier 120 (see FIG. 1), so that the voltage level 572 of the audio signal 570 corresponds to the voltage the amplifier 120 would generate in response to a similar input signal.

The excursion predictor 528 generates a predicted excursion 580 (of the loudspeaker 130) based on the excursion transfer function 546 applied to the voltage level 572. For example, the predicted excursion 580 may correspond to a distance in millimeters that the loudspeaker 130 is predicted to excurse, in response to the voltage level 572 (of the audio signal 570).

The excursion limiter 530 generates an attenuation 582 that depends on an amount by which the predicted excursion 580 exceeds an excursion limit. For example, if the predicted excursion 580 is 0.6 millimeters and the excursion limit is 0.2 millimeters, the attenuation 582 is 3.0. The excursion limit may be adjusted as desired according to the characteristics of the loudspeaker 130 (see FIG. 1). The attenuation 582 may also be referred to as the excursion attenuation. The excursion limiter 530 provides the excursion attenuation to the multiband compressor 514 as the feedback signal 558.

The audio limiter 532 generates an attenuation 584 that depends on an amount by which the audio signal 570 exceeds an audio limit. For example, if the level of the audio signal 570 is −3 dBFS and the audio limit is −9 dBFS, the attenuation 584 is 6 dB. The audio limit may be adjusted as desired according to the characteristics of the loudspeaker 130 (see FIG. 1). The attenuation 584 may also be referred to as the audio attenuation. The audio limiter 532 provides the audio attenuation to the multiband compressor 518 as the feedback signal 564.

The attenuator 534 generates the modified audio signal 162 (see FIG. 1) by applying, to the audio signal 570, an attenuation value corresponding to the maximum of the attenuation 582 and the attenuation 584. (The attenuator 534 may operate as a wideband attenuator, applying the attenuation value to all bands of the audio signal 570.) In this manner, the attenuator 534 performs attenuation on the audio signal 570 so that neither the excursion limit nor the audio limit is exceeded. However, since the audio signal 570 has been prospectively modified according to the feedback signals 558 and 564, there is less need for the attenuator 534 itself to attenuate the audio signal 570.

In summary, the excursion predictor 500 uses two internal feedback signals (the feedback signals 558 and 564), whereas the excursion predictor 400 (see FIG. 4) uses one internal feedback signal (the feedback signal 442). More specifically, the feedback signal 558 corresponds more directly to the excursion attenuation, and the feedback signal 564 corresponds more directly to the audio attenuation, whereas the feedback signal 442 (see FIG. 4) corresponds to the maximum of the excursion attenuation and the audio attenuation.

As mentioned above, the excursion protector 500 is similar to the excursion protector 110 (see FIGS. 1-2), and may be used in place of the excursion protector 110 in the loudspeaker system 100 of FIG. 1. In general, the components of the excursion protector 500 correspond to the components of the excursion protector 110. More specifically, the signal converter 506, the excursion predictor 508, the transformer 510, the filter 512, the multiband compressor 514, the filter 516, the multiband compressor 518, and the selector 520 (see FIG. 5) provide more detail to the multiband compressor 206 (see FIG. 2); the voltage feedback signal 542 and the current feedback signal 544 provide more detail to the feedback signal 160; the signal converter 526 and the excursion predictor 528 provide more detail to the excursion predictor 212; the excursion limiter 530, the audio limiter 532 and the attenuator 534 provide more detail to the attenuator 214; and the feedback signal 558 and the feedback signal 564 provide more detail to the feedback signal 228.

Transfer Function Details

A voltage-to-excursion transfer function for a loudspeaker may be calculated in a number of ways. It may be expressed as a function mapping an input of a given voltage level at a particular frequency expressed in Hz, to an output of excursion level in mm.

For the purposes of multiband compression, the function may be simplified to one that maps an input of an arbitrary voltage level at a particular frequency expressed in Hz, to an output of excursion level relative to the excursion level at some reference frequency, expressed in dB. For example, such a function may map from the following frequencies to their relative excursion levels, where 0 Hz is the reference frequency:

TABLE 1

| Frequency (Hz) | Relative Excursion Level (dB) |
|---|---|
| 0 | 0.0 |
| 100 | 0.0 |
| 200 | 0.5 |
| 400 | 2.0 |
| 500 | 2.9 |
| 600 | 3.6 |
| 700 | 3.3 |
| 800 | 1.6 |
| 900 | −0.5 |
| 1000 | −2.6 |
| Etc. | Etc. |

As one example, the voltage-to-excursion transfer function estimator 404 (see FIG. 4) may be prepopulated with a transfer function expressed as a lookup table that maps a frequency in Hz at some resolution to a relative amount of excursion in dB, such as that in the above example. The transfer function estimator may simply discard the voltage feedback 432 and current feedback 434 from the amplifier 120 and continue to report the transfer function it was initialized with.

Alternatively, the transfer function estimator may be prepopulated with coefficients for its internal representation of the voltage-to-excursion transfer function, such as the physical properties of the speaker. In one electromechanical model for a speaker, the following speaker characteristics may be used: force factor (B1), resonant frequency (F0), DC impedance (Re), peak impedance (Res), total Q (Qts), and coil inductance (Le). The ETF estimator 404 may then use voltage feedback 432 and current feedback 434 to continually adapt an estimate of impedance over time, from which it can adapt these speaker characteristics.

Alternatively, the transfer function estimator may be prepopulated with a lookup table that describes the speaker's electrical impedance, from which the relevant model parameters listed above may be deduced. The transfer function estimator 404 may then use the voltage feedback 432 and the current feedback 434 to continually adapt an estimate of impedance over time in order to continually deduce its model parameters.

Similar functionality may be implemented by other transfer function estimators, such as the ETF estimator 204 (see FIG. 2), the ETF estimator 504 (see FIG. 5), etc.

ERB Banding Details

The ERB (Equivalent Rectangular Bandwidth) band powers are calculated by taking the power sum of the HCQMF bins that are contained within each band in each processing step. Due to the fixed spacing of the HCQMF bins at a given sampling frequency, the bands that are formed are only approximately equal to the ideal ERB bands. For example, at a sampling rate of 48 kHz, the approximate ERB band starting/ending frequencies in Hz may be as follows: 0, 93.75, 187.5, 281.25, 375, 562.5, 750, 937.5, 1125, 1500, 1875, 2625, 3375, 4125, 5250, 6375, 7875, 10125, 12375, 15375, and 24000.

For example, the multiband compressor 408 (see FIG. 4) may calculate a gain per ERB band, based on the power characteristics of the signal, which the amplifier 410 applies to the HCQMF bins that formed each band. As an example, the multiband compressor 408 may be configured in such a way, that if the transfer function 436 indicates that each ERB band contributes equally to excursion, the compressor only attenuates a particular ERB band if the audio power in the band exceeds a threshold of −3 dBFS. In this situation, the multiband compressor 408 is performing its usual function of attenuating frequency bands of audio that are likely to contribute to PCM values that exceed a particular maximum.

In the same example, but with a transfer function 436 indicating that some bands are more likely than others to contribute to high excursions, the multiband compressor 408 may adjust its power thresholds in those bands to cause them to be attenuated at lower audio power thresholds. For example, the transfer function 436 may indicate that the fifth ERB band contributes proportionally more to excursion than do all other bands by a factor of 6 dB, in which case the power threshold for audio in that band may be reduced to −9 dBFS.

The feedback signal 442 from the attenuator 422 is used to further adjust the power thresholds in each band. For example, the feedback signal 442 may indicate that the attenuator 422 is applying −12 dB of gain in order to attenuate the signal 446 appropriately. In that case, the multiband compressor 408 may reduce its thresholds across all ERB bands by 12 dB in order for attenuation to be more likely in each band.

Similar functionality may be implemented by other multiband compressors, such as the multiband compressor 206 (see FIG. 2), the multiband compressor 514 (see FIG. 5), the multiband compressor 518, etc.

Combining Excursion Measurements and Predictions

The loudspeaker system (e.g., the loudspeaker system 100 of FIG. 1) may also include a system for directly measuring loudspeaker excursion, e.g. using a laser. In such a system, the excursion protector may combine the predicted excursion (as calculated according to the excursion transfer function applied to the impedance) and the measured excursion, and may perform the attenuation based on both. For example, the excursion limiter 418 (see FIG. 4) may receive the measured excursion (e.g., measured by a laser in the loudspeaker) in addition to the predicted excursion 450, and may generate the attenuation 452 based on the maximum of the measured excursion and the predicted excursion 450.

Alternatively, the measured excursion may be time-aligned with the output PCM signal (e.g., the modified audio signal 162) and used to form an estimate of the PCM-to-excursion transfer function (e.g., by the excursion transfer function estimator 404), by means of directly modeling the relationship between the two signals as a simple linear system. This could be used in place of, or as well as, voltage and current feedback from the amplifier in the process forming excursion estimates.

Implementation Details

An embodiment may be implemented in hardware, executable modules stored on a computer readable medium, or a combination of both (e.g., programmable logic arrays). Unless otherwise specified, the steps executed by embodiments need not inherently be related to any particular computer or other apparatus, although they may be in certain embodiments. In particular, various general-purpose machines may be used with programs written in accordance with the teachings herein, or it may be more convenient to construct more specialized apparatus (e.g., integrated circuits) to perform the required method steps. Thus, embodiments may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein. (Software per se and intangible or transitory signals are excluded to the extent that they are unpatentable subject matter.)

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

Various aspects of the present invention may be appreciated from the following enumerated example embodiments (EEEs):

1. An apparatus for excursion protection of a loudspeaker, the apparatus comprising:
    a first transformer that is configured to transform a first audio signal into a second audio signal, wherein the first audio signal is in a time domain, wherein the second audio signal is in a transform domain other than the time domain, and wherein the second audio signal has a plurality of bands;
    an excursion transfer function estimator that is configured to estimate an excursion transfer function of the loudspeaker based on information related to driving the loudspeaker;
    a multiband compressor that is configured to generate a plurality of gains for a subset of the plurality of bands of the second audio signal based on the excursion transfer function, wherein the multiband compressor is controlled by a feedback signal;
    an amplifier that is configured to generate a third audio signal by applying the plurality of gains to the subset of the plurality of bands of the second audio signal;
    a second transformer that is configured to transform the third audio signal into a fourth audio signal, wherein the fourth audio signal is in the time domain;
    an excursion predictor that is configured to generate a predicted excursion of the loudspeaker based on the excursion transfer function and the fourth audio signal; and
    an attenuator that is configured to generate a fifth audio signal by attenuating the fourth audio signal by an attenuation value according to the predicted excursion, wherein the feedback signal corresponds to the attenuation value, and wherein the fifth audio signal is provided to the loudspeaker.

2. The apparatus of EEE 1, wherein the transform domain is a discrete Fourier transform (DFT) filterbank domain, wherein the plurality of bands is non-uniform, and wherein the plurality of bands is 77 bands.

3. The apparatus of any one of EEEs 1-2, wherein the excursion transfer function estimator is configured to store a stored excursion transfer function, and wherein the excursion transfer function estimator is configured to generate the excursion transfer function by modifying the stored excursion transfer function according to the information related to driving the loudspeaker, wherein the information related to driving the loudspeaker comprises voltage information and current information related to the fifth audio signal.

4. The apparatus of any one of EEEs 1-3, wherein the multiband compressor further comprises:
    a filter that is configured to perform equivalent rectangular bandwidth (ERB) banding on the second audio signal to generate the plurality of bands.

5. The apparatus of any one of EEEs 1-4, wherein the excursion predictor further comprises:
    a signal converter that is configured to convert the fourth audio signal into a voltage level, wherein the excursion predictor is configured to generate the predicted excursion based on the voltage level applied to the excursion transfer function.

6. The apparatus of any one of EEEs 1-5, wherein the attenuator further comprises:
    an excursion limiter that is configured to generate an excursion attenuation based on the predicted excursion and an excursion limit; and
    an audio limiter that is configured to generate an audio attenuation based on the fourth audio signal and an audio limit,
    wherein the attenuator is configured to attenuate the fourth audio signal based on a maximum of the excursion attenuation and the audio attenuation, wherein the feedback signal corresponds to the maximum of the excursion attenuation and the audio attenuation.

7. The apparatus of any one of EEEs 1-6, wherein the multiband compressor comprises:
    a signal converter that is configured to convert the fourth audio signal into a voltage level;
    a second excursion predictor that is configured to generate a second predicted excursion based on the voltage level applied to the excursion transfer function;
    a third transformer that is configured to transform the second predicted excursion into a sixth audio signal, wherein the sixth audio signal is in the transform domain;
    a first filter that is configured to perform equivalent rectangular bandwidth (ERB) banding on the sixth audio signal to generate a first plurality of bands;
    a first multiband compressor that is configured to generate a first plurality of gains for a subset of the first plurality of bands of the sixth audio signal based on a first feedback signal;
    a second filter that is configured to perform ERB banding on the second audio signal to generate a second plurality of bands;
    a second multiband compressor that is configured to generate a second plurality of gains for a subset of the second plurality of bands of the second audio signal based on a second feedback signal; and
    a selector that is configured to generate the plurality of gains for the subset of the plurality of bands of the second audio signal by selecting a gain for each band from a maximum attenuation of the first plurality of gains and the second plurality of gains,
    wherein the feedback signal comprises the first feedback signal and the second feedback signal.

8. The apparatus of EEE 7, wherein the attenuator further comprises:
    an excursion limiter that is configured to generate an excursion attenuation based on the predicted excursion and an excursion limit, and to provide the excursion attenuation to the first multiband compressor as the first feedback signal; and
    an audio limiter that is configured to generate an audio attenuation based on the fourth audio signal and an audio limit, and to provide the audio attenuation to the second multiband compressor as the second feedback signal,
    wherein the attenuator is configured to attenuate the fourth audio signal based on a maximum of the excursion attenuation and the audio attenuation.

9. The apparatus of any one of EEEs 1-8, further comprising:
    a connected loudspeaker that corresponds to the loudspeaker; and an amplifier that is configured to receive the fifth audio signal and to control the connected loudspeaker to output an audible signal corresponding to the fifth audio signal.

10. The apparatus of EEE 9, wherein the amplifier is configured to provide the information related to driving the connected loudspeaker to the excursion transfer function estimator, and wherein the information related to driving the connected loudspeaker corresponds to voltage information and current information that results from the connected loudspeaker outputting the audible signal corresponding to the fifth audio signal.

11. The apparatus of any one of EEEs 1-10, further comprising:
a laser that measures an actual excursion of the loudspeaker,
wherein the attenuator is configured to generate the fifth audio signal by attenuating the fourth audio signal by the attenuation value according to the predicted excursion and the actual excursion.

12. A method of excursion protection of a loudspeaker, the method comprising:
transforming a first audio signal into a second audio signal, wherein the first audio signal is in a time domain, wherein the second audio signal is in a transform domain other than the time domain, and wherein the second audio signal has a plurality of bands;
generating an excursion transfer function of the loudspeaker based on information related to driving the loudspeaker;
generating a plurality of gains for a subset of the plurality of bands of the second audio signal based on the excursion transfer function, wherein generating the plurality of gains is controlled by a feedback signal;
generating a third audio signal by applying the plurality of gains to the subset of the plurality of bands of the second audio signal;
transforming the third audio signal into a fourth audio signal, wherein the fourth audio signal is in the time domain;
generating a predicted excursion of the loudspeaker based on the excursion transfer function and the fourth audio signal; and
generating a fifth audio signal by attenuating the fourth audio signal by an attenuation value according to the predicted excursion, wherein the feedback signal corresponds to the attenuation value, and wherein the fifth audio signal is provided to the loudspeaker.

13. The method of EEE 12, further comprising:
outputting, from the loudspeaker, an audible signal corresponding to the fifth audio signal, wherein the information related to driving the loudspeaker is generated in accordance with outputting the audible signal.

14. The method of any one of EEEs 12-13, further comprising:
storing a stored excursion transfer function,
wherein generating the excursion transfer function comprises generating the excursion transfer function by modifying the stored excursion transfer function according to the information related to driving the loudspeaker, wherein the information related to driving the loudspeaker comprises voltage information and current information related to the fifth audio signal.

15. The method of any one of EEEs 12-14, further comprising:

performing equivalent rectangular bandwidth (ERB) banding on the second audio signal to generate the plurality of bands.

16. The method of any one of EEEs 12-15, further comprising:
converting the fourth audio signal into a voltage level, wherein generating the predicted excursion comprises generating the predicted excursion based on the voltage level applied to the excursion transfer function.

17. The method of any one of EEEs 12-16, further comprising:
generating an excursion attenuation based on the predicted excursion and an excursion limit; and
generating an audio attenuation based on the fourth audio signal and an audio limit,
wherein generating the fifth audio signal comprises generating the fifth audio signal by attenuating the fourth audio signal based on a maximum of the excursion attenuation and the audio attenuation, wherein the feedback signal corresponds to the maximum of the excursion attenuation and the audio attenuation.

18. The method of any one of EEEs 12-17, further comprising:
converting the fourth audio signal into a voltage level;
generating a second predicted excursion based on the voltage level applied to the excursion transfer function;
transforming the second predicted excursion into a sixth audio signal, wherein the sixth audio signal is in the transform domain;
performing equivalent rectangular bandwidth (ERB) banding on the sixth audio signal to generate a first plurality of bands;
generating a first plurality of gains for a subset of the first plurality of bands of the sixth audio signal based on a first feedback signal;
performing ERB banding on the second audio signal to generate a second plurality of bands;
generating a second plurality of gains for a subset of the second plurality of bands of the second audio signal based on a second feedback signal; and
generating the plurality of gains for the subset of the plurality of bands of the second audio signal by selecting a gain for each band from a maximum attenuation of the first plurality of gains and the second plurality of gains,
wherein the feedback signal comprises the first feedback signal and the second feedback signal.

19. The method of any one of EEEs 12-18, further comprising:
receiving, by an amplifier, the fifth audio signal; and
controlling, by the amplifier, the loudspeaker to output an audible signal corresponding to the fifth audio signal.

20. A non-transitory computer readable medium storing a computer program that, when executed by a processor, controls an apparatus to execute processing including the method of any one of EEEs 12-19.

The invention claimed is:

1. An apparatus for excursion protection of a loudspeaker, the apparatus comprising:
a first transformer that is configured to transform a first audio signal into a second audio signal, wherein the first audio signal is in a time domain, wherein the second audio signal is in a transform domain other than the time domain, and wherein the second audio signal has a plurality of bands;
an excursion transfer function estimator that is configured to generate an excursion transfer function of the loudspeaker by applying a feedback signal received by the excursion transfer function estimator to an excursion model of the loudspeaker stored by the excursion transfer function estimator;

a multiband compressor that is configured to generate a plurality of gains for a subset of the plurality of bands of the second audio signal based on the excursion transfer function, as controlled by a further feedback signal, received by the multiband compressor;

an amplifier that is configured to generate a third audio signal by applying the plurality of gains to the subset of the plurality of bands of the second audio signal;

a second transformer that is configured to transform the third audio signal into a fourth audio signal, wherein the fourth audio signal is in the time domain;

an excursion predictor that is configured to generate a predicted excursion of the loudspeaker based on the excursion transfer function and the fourth audio signal; and an attenuator that is configured to generate a fifth audio signal by attenuating the fourth audio signal by an attenuation value according to the predicted excursion, and to provide the attenuation value as a feedback signal to the multiband compressor.

2. The apparatus of claim 1, wherein the multiband compressor is configured to calculate a gain per band based on the power characteristics of the second audio signal; to only attenuate a particular band if the audio power in the band exceeds a certain threshold, and to use the attenuation value to adjust the power threshold in each band.

3. The apparatus of claim 1, wherein the transform domain is a discrete Fourier transform (DFT) filterbank domain, wherein the plurality of bands is non-uniform, and wherein the plurality of bands is 77 bands.

4. The apparatus of claim 1, wherein the excursion transfer function estimator is configured to store a stored excursion transfer function, and wherein the excursion transfer function estimator is configured to generate the excursion transfer function by modifying the stored excursion transfer function according to the feedback signal received by the excursion transfer function estimator.

5. The apparatus of claim 1, wherein the feedback signal received by the excursion transfer function estimator comprises voltage information and current information related to the fifth audio signal.

6. The apparatus of claim 1, wherein the multiband compressor further comprises:

a filter that is configured to perform equivalent rectangular bandwidth (ERB) banding on the second audio signal to generate the plurality of bands.

7. The apparatus of claim 1, wherein the excursion predictor further comprises:

a signal converter that is configured to convert the fourth audio signal into a voltage level, wherein the excursion predictor is configured to generate the predicted excursion based on the voltage level applied to the excursion transfer function.

8. The apparatus of claim 1, wherein the attenuator further comprises:

an excursion limiter that is configured to generate an excursion attenuation based on the predicted excursion and an excursion limit; and an audio limiter that is configured to generate an audio attenuation based on the fourth audio signal and an audio limit, wherein the attenuator is configured to attenuate the fourth audio signal based on a maximum of the excursion attenuation and the audio attenuation, and to provide the maximum of the excursion attenuation and the audio attenuation as a feedback signal to the multiband compressor.

9. The apparatus of claim 1, wherein the multiband compressor comprises:

a signal converter that is configured to convert the first audio signal into a voltage level;

a second excursion predictor that is configured to generate a second predicted excursion based on the voltage level applied to the excursion transfer function;

a third transformer that is configured to transform the second predicted excursion into a sixth audio signal, wherein the sixth audio signal is in the transform domain;

a first filter that is configured to perform equivalent rectangular bandwidth (ERB) banding on the sixth audio signal to generate a first plurality of bands;

a first multiband compressor that is configured to generate a first plurality of gains for a subset of the first plurality of bands of the sixth audio signal based on a feedback signal received by the first multiband compressor;

a second filter that is configured to perform ERB banding on the second audio signal to generate a second plurality of bands;

a second multiband compressor that is configured to generate a second plurality of gains for a subset of the second plurality of bands of the second audio signal based on a feedback signal received by the second multiband compressor; and a selector that is configured to generate the plurality of gains for the subset of the plurality of bands of the second audio signal by selecting a gain for each band from a maximum attenuation of the first plurality of gains and the second plurality of gains, wherein the attenuator is configured to provide a first feedback signal to the first multiband compressor, and to provide a second feedback signal to the second multiband compressor.

10. The apparatus of claim 9, wherein the attenuator further comprises:

an excursion limiter that is configured to generate an excursion attenuation based on the predicted excursion and an excursion limit, and to provide the excursion attenuation to the first multiband compressor as the first feedback signal; and an audio limiter that is configured to generate an audio attenuation based on the fourth audio signal and an audio limit, and to provide the audio attenuation to the second multiband compressor as the second feedback signal, wherein the attenuator is configured to attenuate the fourth audio signal based on a maximum of the excursion attenuation and the audio attenuation.

11. A system comprising the apparatus of claim 1, further comprising:

a connected loudspeaker; and an amplifier that is configured to receive the fifth audio signal and to control the connected loudspeaker to output an audible signal corresponding to the fifth audio signal.

12. The system of claim 11, wherein the amplifier is configured to provide a feedback signal to the excursion transfer function estimator, corresponding to voltage information and current information that results from the connected loudspeaker outputting the audible signal corresponding to the fifth audio signal.

13. The system of claim 11, further comprising:
a laser that measures an actual excursion of the loudspeaker,
wherein the attenuator is configured to generate the fifth audio signal by attenuating the fourth audio signal by an attenuation value according to the predicted excursion and the actual excursion.

14. A method of excursion protection of a loudspeaker, the method comprising:
transforming a first audio signal into a second audio signal, wherein the first audio signal is in a time domain, wherein the second audio signal is in a transform domain other than the time domain, and wherein the second audio signal has a plurality of bands;
generating an excursion transfer function of the loudspeaker by applying a feedback signal to an excursion model of the loudspeaker;
generating a plurality of gains for a subset of the plurality of bands of the second audio signal based on the excursion transfer function, as controlled by a further feedback signal;
generating a third audio signal by applying the plurality of gains to the subset of the plurality of bands of the second audio signal;
transforming the third audio signal into a fourth audio signal, wherein the fourth audio signal is in the time domain;
generating a predicted excursion of the loudspeaker based on the excursion transfer function and the fourth audio signal;
generating a fifth audio signal by attenuating the fourth audio signal by an attenuation value according to the predicted excursion, and
providing the attenuation value as the further feedback signal.

15. The method of claim 14, further comprising:
outputting, from the loudspeaker, an audible signal corresponding to the fifth audio signal, wherein the feedback signal applied to an excursion model of the loudspeaker is generated in accordance with outputting the audible signal.

16. The method of claim 14, further comprising:
storing a stored excursion transfer function,
wherein applying a feedback signal to an excursion model of the loudspeaker comprises modifying the stored excursion transfer function according to the feedback signal.

17. The method of claim 14, wherein the feedback signal applied to an excursion model of the loudspeaker comprises voltage information and current information related to the fifth audio signal.

18. The method of claim 14, further comprising:
performing equivalent rectangular bandwidth (ERB) banding on the second audio signal to generate the plurality of bands.

19. The method of claim 14, further comprising:
converting the fourth audio signal into a voltage level, wherein generating the predicted excursion comprises generating the predicted excursion based on the voltage level applied to the excursion transfer function.

20. The method of claim 14, further comprising:
generating an excursion attenuation based on the predicted excursion and an excursion limit; and
generating an audio attenuation based on the fourth audio signal and an audio limit,
wherein generating the fifth audio signal comprises generating the fifth audio signal by attenuating the fourth audio signal based on a maximum of the excursion attenuation and the audio attenuation.

21. The method of claim 14, further comprising:
converting the first audio signal into a voltage level;
generating a second predicted excursion based on the voltage level applied to the excursion transfer function;
transforming the second predicted excursion into a sixth audio signal, wherein the sixth audio signal is in the transform domain;
performing equivalent rectangular bandwidth (ERB) banding on the sixth audio signal to generate a first plurality of bands;
generating a first plurality of gains for a subset of the first plurality of bands of the sixth audio signal based on the excursion transfer function, as controlled by a first feedback signal;
performing ERB banding on the second audio signal to generate a second plurality of bands;
generating a second plurality of gains for a subset of the second plurality of bands of the second audio signal based on the excursion transfer function, as controlled by a second feedback signal; and
generating the plurality of gains for the subset of the plurality of bands of the second audio signal by selecting a gain for each band from a maximum attenuation of the first plurality of gains and the second plurality of gains.

22. The method of claim 14, further comprising:
receiving, by an amplifier, the fifth audio signal; and
controlling, by the amplifier, the loudspeaker to output an audible signal corresponding to the fifth audio signal.

23. A non-transitory computer readable medium storing a computer program that, when executed by a processor, controls an apparatus to execute processing including the method of claim 14.

* * * * *